(12) United States Patent
Holman et al.

(10) Patent No.: US 11,430,900 B2
(45) Date of Patent: Aug. 30, 2022

(54) WAVELENGTH-SELECTIVE SPECULARLY REFLECTING PHOTOVOLTAIC MODULE AND MANUFACTURE THEREOF

(71) Applicants: Zachary Holman, Phoenix, AZ (US); Kathryn Fisher, Scottsdale, AZ (US); Xiaodong Meng, Tempe, AZ (US)

(72) Inventors: Zachary Holman, Phoenix, AZ (US); Kathryn Fisher, Scottsdale, AZ (US); Xiaodong Meng, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 15/683,254

(22) Filed: Aug. 22, 2017

(65) Prior Publication Data

US 2018/0053862 A1 Feb. 22, 2018

Related U.S. Application Data

(60) Provisional application No. 62/377,892, filed on Aug. 22, 2016.

(51) Int. Cl.
*H01L 31/0216* (2014.01)
*H01L 31/056* (2014.01)
(Continued)

(52) U.S. Cl.
CPC .. *H01L 31/02167* (2013.01); *H01L 31/02162* (2013.01); *H01L 31/0481* (2013.01);
(Continued)

(58) Field of Classification Search
None
See application file for complete search history.

(56) References Cited

U.S. PATENT DOCUMENTS 6,093,757 A * 7/2000 Pern ................. B32B 17/10678
136/251
8,981,203 B2 3/2015 Hwang et al.
(Continued)

FOREIGN PATENT DOCUMENTS

WO 2015117134 A1 8/2015
WO 2015155356 A1 10/2015
(Continued)

OTHER PUBLICATIONS

Ulavi, T. et al., "Analysis of a Hybrid PV/T Concept Based on Wavelength Selective Mirror Films", Journal of Solar Energy Engineering, Aug. 2014 [available online Mar. 2014], vol. 136, pp. 031009-1-031009-9 <DOI:10.1115/1.4026678>.
(Continued)

*Primary Examiner* — Shannon M Gardner
(74) *Attorney, Agent, or Firm* — Fish & Richardson P.C.

(57) ABSTRACT

A photovoltaic module comprises a plurality of photovoltaic cells, and a polymeric film positioned on an incident light side of the plurality of photovoltaic cells, wherein the polymeric film transmits a range of wavelengths of the incident light spectrum and specularly reflects wavelengths outside of the range. An encapsulant layer is in contact with the polymeric film. The polymeric film may have a first surface area larger than a second surface area of the layer of photovoltaic cells. The polymeric film may have one or more through-holes so that encapsulant can penetrate through the through-holes at elevated temperature during lamination thereby bonding to a front glass of the photovoltaic module.

23 Claims, 12 Drawing Sheets

(51) Int. Cl.
*H01L 31/18* (2006.01)
*H01L 31/048* (2014.01)

(52) U.S. Cl.
CPC ........ *H01L 31/056* (2014.12); *H01L 31/1876* (2013.01); *Y02E 10/52* (2013.01); *Y02P 70/50* (2015.11)

(56) References Cited

U.S. PATENT DOCUMENTS

| | | |
|---|---|---|
| 10,092,926 B2 | 10/2018 | Firth et al. |
| 10,396,232 B2 | 8/2019 | Zhang et al. |
| 2017/0012155 A1 | 1/2017 | Holman et al. |
| 2019/0100841 A1 | 4/2019 | Firth et al. |
| 2019/0393832 A1 | 12/2019 | Angel et al. |

FOREIGN PATENT DOCUMENTS

| | | |
|---|---|---|
| WO | 2015155357 A1 | 10/2015 |
| WO | 2016200988 A1 | 12/2016 |
| WO | 2017172962 A1 | 10/2017 |
| WO | 2017210478 A1 | 12/2017 |

OTHER PUBLICATIONS

Yamada, N. et al., "Design of wavelength selective concentrator for micro PV/TPV systems using evolutionary algorithm", Optics Express, Jul. 2011, vol. 19, No. 14, pp. 13140-13149 <DOI:10.1364/OE.19.013140>.

* cited by examiner

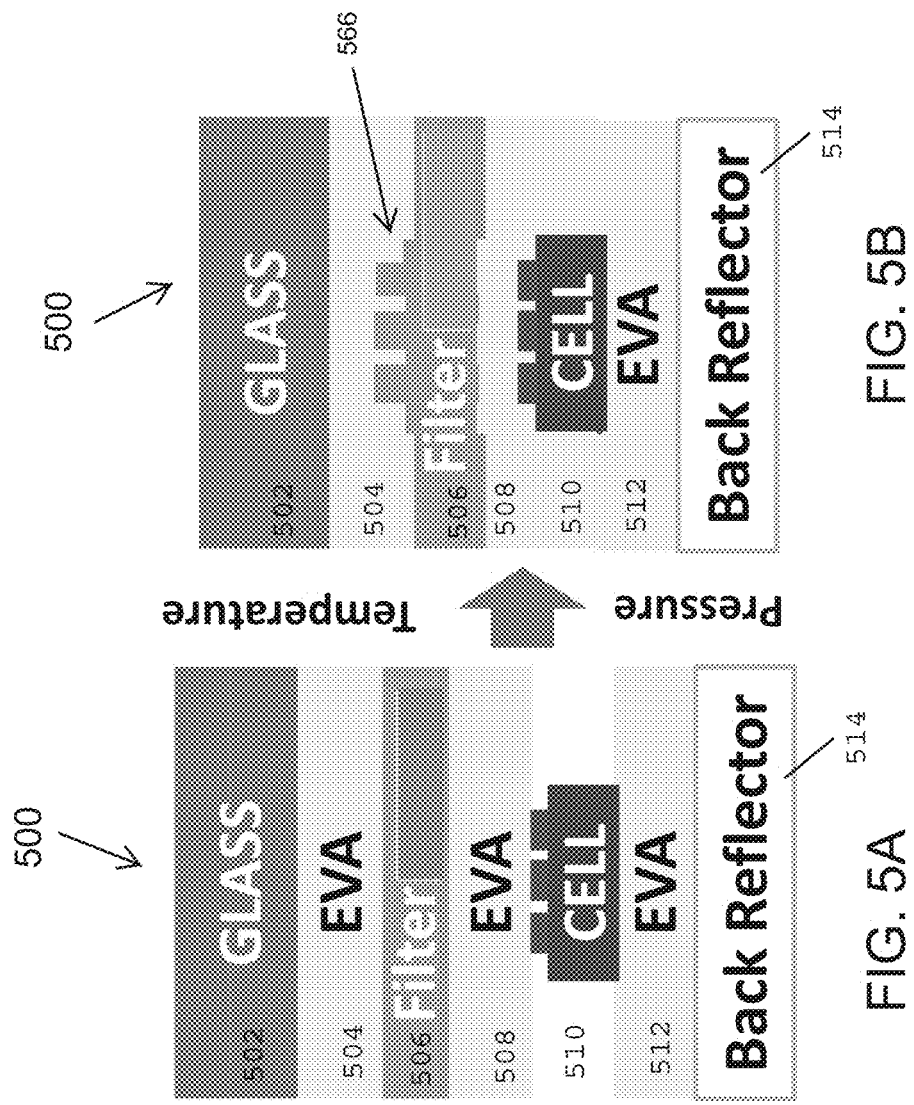

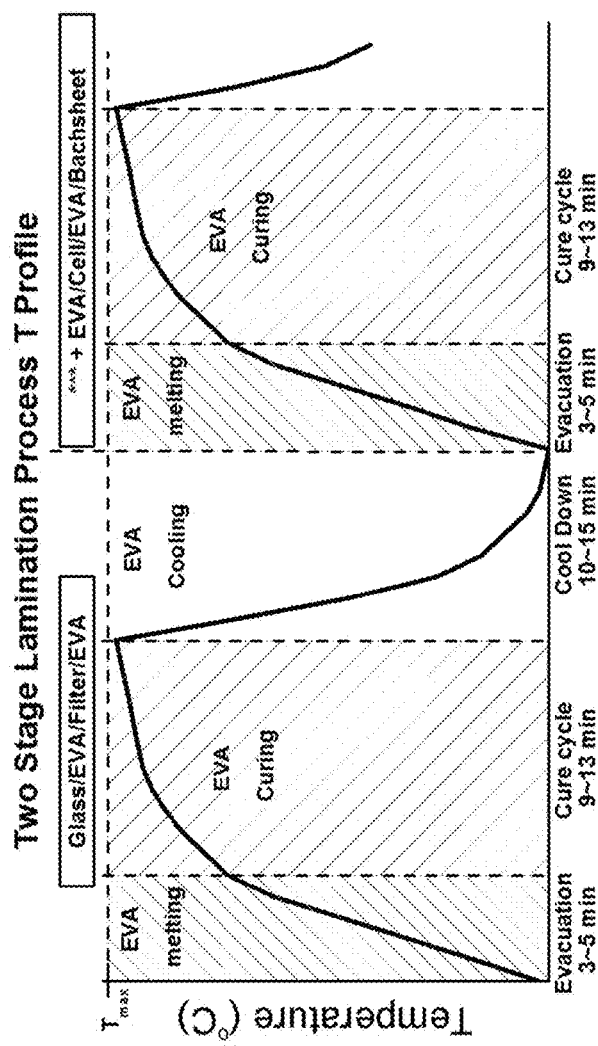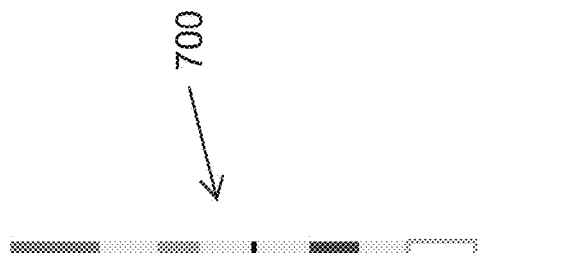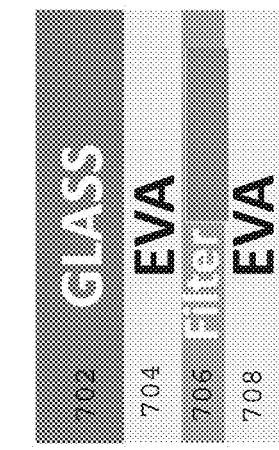

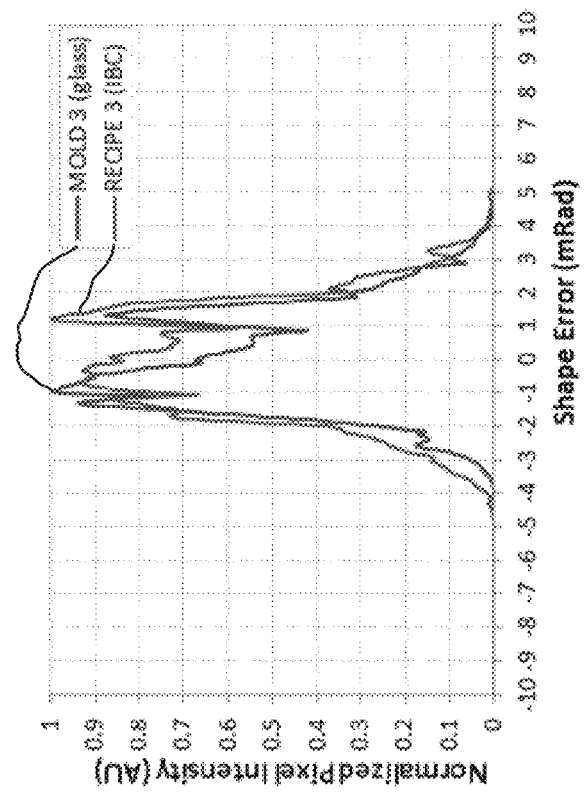
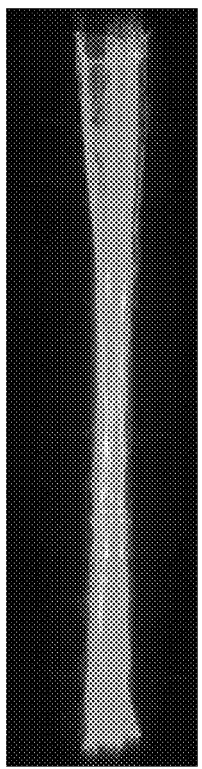
FIG.7B
2-Stage Lamination
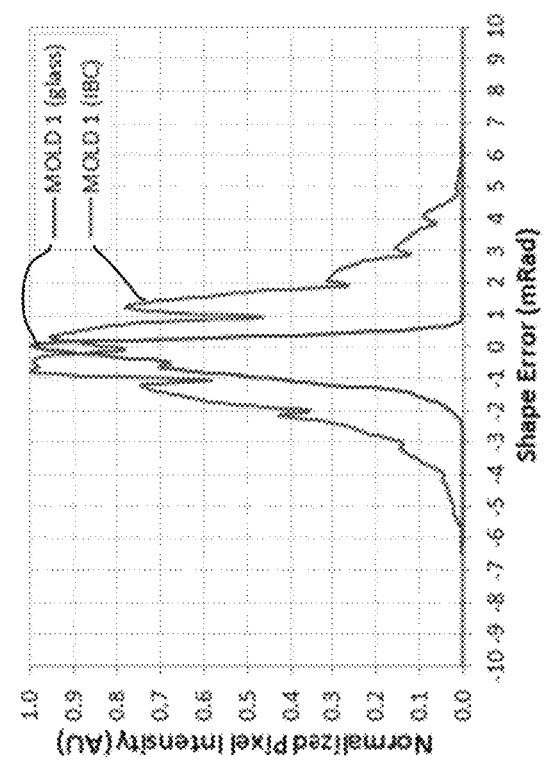
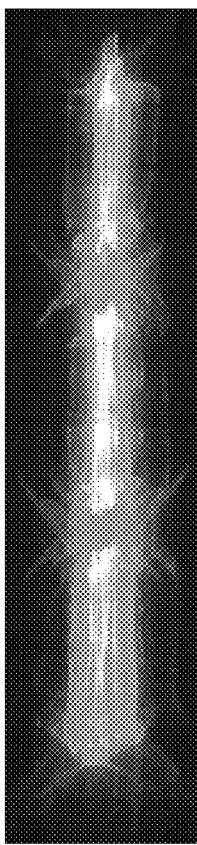
FIG.7A
1-Stage Lamination

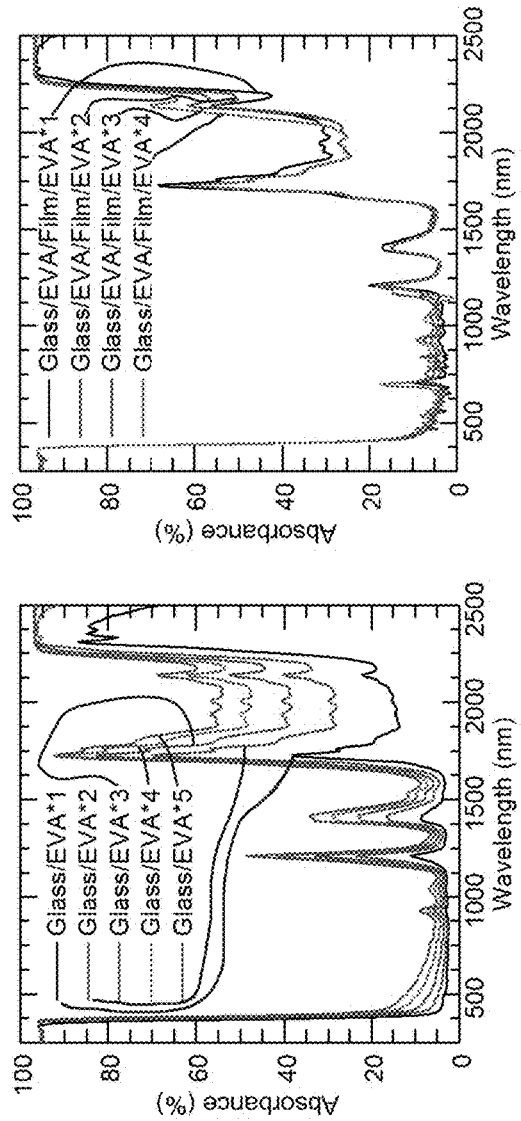

WAVELENGTH-SELECTIVE SPECULARLY REFLECTING PHOTOVOLTAIC MODULE AND MANUFACTURE THEREOF

CROSS REFERENCES TO RELATED APPLICATIONS

This application claims priority to U.S. Patent Application No. 62/377,892 filed Aug. 22, 2016.

STATEMENT REGARDING FEDERALLY SPONSORED RESEARCH

This invention was made with government support under DE-AR0000474 awarded by U.S. Department of Energy. The government has certain rights in the invention.

FIELD OF THE INVENTION

The invention relates to a photovoltaic module that has an integrated polymeric film that transmits particular wavelengths of the solar spectrum and specularly reflects other wavelengths. This invention particularly pertains to the architecture (materials and layer order) and method of manufacture (fabrication method and procedure) of the photovoltaic module, with an advantage of eliminating waviness of the polymeric film.

BACKGROUND OF INVENTION

Photovoltaic cells do not convert solar photons of all energies to electricity with equal efficiency. Photons with energies smaller than the band gap energy of the semiconductor used as the absorbing material in the photovoltaic cell are not absorbed, and thus converted with zero efficiency. Photons with energies much larger than the semiconductor band gap energy result in only as much electrical energy as photons with exactly the band gap energy; their excess energy generates waste heat. Photons with energies similar to, but greater than, the semiconductor band gap energy are converted most efficiently: this efficiency may, for example, reach 50% in the best silicon photovoltaic cells and 70% in the best gallium indium phosphide photovoltaic cells.

In some instances, it may be desirable for photovoltaic cells to absorb only those photon energies that may be most efficiently converted, and to prevent lower-energy photons, higher-energy photons, or both from reaching the photovoltaic cells. This may reduce heat generation in the photovoltaic cells, where heat generation results in a decrease of their energy-conversion efficiency. In one instance, the lower- and higher-energy photons may be reflected by a spectrally selective element located at the incident light side of a photovoltaic module comprising an array of photovoltaic cells.

The reflected photons may be reflected in such a manner as to serve another desirable purpose. They may, for example, be reflected in a diffuse nature (scattered) so that the photovoltaic module has a white or colored diffuse appearance that is attractive to the human eye, as described in WO 2015/155356A1 and WO 2015/155357A1. Alternatively, the photons may be reflected in a specular nature to, for example, a second solar-energy converter spaced some distance from the photovoltaic module—hereafter called a receiver—that more favorably uses these photon energies, as described in WO 2015/117134A1.

Such a photovoltaic module with a specularly reflecting, spectrally selective element is hereafter called a PVMirror. PVMirrors may be curved in such a manner that the specularly reflected photons are focused upon the receiver such that it operates under concentrated illumination. Alternatively, several planar PVMirrors may be arranged in an array and each pointed in a manner such that their collective reflected light is directed at the receiver. To maximize the energy output of the receiver, all of the photons reflected by the PVMirror(s) should be incident upon the receiver; no photon should be reflected into an angle such that it misses the receiver.

Waviness in PVMirrors is undesirable, as it can cause reflected photons to miss the receiver, resulting in a lowered efficiency. It is difficult to produce a PVMirror that lacks waviness. One cause of waviness is deformation of the malleable polymeric film and adjacent encapsulant layers by the rigid photovoltaic cells during lamination. For example, the shapes of the edges of the photovoltaic cells or the metal ribbons soldered to the front surface of the photovoltaic cells may be transferred to the polymeric film during lamination. In this case, the polymeric film is not fully conformal to the front glass and may be conformal to the photovoltaic cells, causing undesirable waviness, and a resulting lower PVMirror system efficiency.

Therefore, what is needed is a photovoltaic module having improved efficiency.

SUMMARY OF THE INVENTION

The foregoing needs are met by a photovoltaic module and a method for fabricating a photovoltaic module according to the invention.

In one aspect, the present disclosure provides a photovoltaic module comprising a plurality of photovoltaic cells; a polymeric film positioned on an incident light side of the plurality of photovoltaic cells, wherein the polymeric film transmits a range of wavelengths of the incident light spectrum and specularly reflects wavelengths outside of the range; and an encapsulant layer in contact with the polymeric film. The range of wavelengths may be 700-1100 nanometers. The polymeric film may have a thickness of 100 micrometers to 500 micrometers.

The photovoltaic module may further comprise a front glass positioned on an incident light side of the polymeric film. The encapsulant layer may be positioned between and contacting the plurality of photovoltaic cells and the polymeric film. This encapsulant layer may have a thickness of 400 micrometers to 1000 micrometers. An additional encapsulant layer may be positioned on the incident light side of the polymeric film. This additional encapsulant layer may have a thickness of 100 micrometers to 500 micrometers. The encapsulant layer may comprise a first polymer selected from ethylene vinyl acetate, polyvinyl butyral, silicones, and ionomers. The additional encapsulant layer may comprise a second polymer selected from ethylene vinyl acetate, polyvinyl butyral, silicones, and ionomers. These first and second polymers may be the same or different. The photovoltaic module may have a third encapsulant layer positioned on a side of the plurality of photovoltaic cells opposite the incident light side. There may be a back sheet contacting this third encapsulant layer. The polymeric film may have at least one through-hole. The polymeric film may comprise multiple layers of polymers, wherein at least two of the polymers have a different refractive index. One or more of the layers on the incident light side of the polymeric film may absorb ultraviolet light. The photovoltaic module may be curved. The polymeric film may have a surface waviness of less than at least one of 1, 2, 3, 4, 5, 10, 15, 20, 25, 30, 40, 50, 60, 70, 80, 90, or 100 micrometers. As used herein, surface waviness is defined as a distance between a first straight line circumscribing the two maximum points in the local surface and a second straight line in parallel with the first straight line and circumscribing the minimum point of the local surface.

In another aspect, the present disclosure provides a method for fabricating a photovoltaic module comprising the preparation of a layer of photovoltaic cells; the arrangement of a polymeric film on an incident light side of the layer of photovoltaic cells, wherein the polymeric film transmits a range of wavelengths of the solar spectrum and specularly reflects wavelengths outside of the range; and the placement of an encapsulant layer in contact with the polymeric film.

The method may further comprise laminating the encapsulant layer between the polymeric film and the layer of photovoltaic cells. A portion of the encapsulant layer may fill a through-hole in the polymeric film. The method may also include the lamination of an additional encapsulant layer on an incident light side of the polymeric film. The fabrication method may also comprise arranging multiple layers of the polymeric film on the incident light side of the layer of photovoltaic cells, wherein at least two of the layers have a different refractive index. Also, it may further include a third encapsulant layer positioned on a side of the layer of photovoltaic cells opposite the incident light side. The lamination of a back sheet contacting the third encapsulant layer may occur. During lamination, a support structure may be placed under the photovoltaic cells. The polymeric film may be first laminated between the encapsulant layer and the additional encapsulant layer, followed by the encapsulant layer then being laminated to the photovoltaic cells. The method may include the polymeric film being first laminated between the encapsulant layer and the additional encapsulant layer, followed by the encapsulant layer then being laminated to another encapsulant layer on the photovoltaic cells.

In yet another aspect, the present disclosure provides a photovoltaic module comprising a plurality of photovoltaic cells and a polymeric film positioned on an incident light side of the plurality of photovoltaic cells, wherein the polymeric film transmits a range of wavelengths of the incident light spectrum and specularly reflects wavelengths outside of the range, also wherein the polymeric film has a first surface area larger than a second surface area of the plurality of photovoltaic cells. The range of wavelengths may be 700-1100 nanometers. The polymeric film may have a thickness of 100 micrometers to 500 micrometers.

The photovoltaic module may further comprise a front glass positioned on an incident light side of the polymeric film. There may be an encapsulant layer positioned between and contacting the plurality of photovoltaic cells and the polymeric film. The encapsulant layer may have a thickness of 400 micrometers to 1000 micrometers. An additional encapsulant layer may be positioned on an incident light side of the polymeric film. The additional encapsulant layer may have a thickness of 100 micrometers to 500 micrometers. The encapsulant layer may comprise a first polymer selected from ethylene vinyl acetate, polyvinyl butyral, silicones, and ionomers. The additional encapsulant layer may comprise a second polymer selected from ethylene vinyl acetate, polyvinyl butyral, silicones, and ionomers. These first and second polymers may be the same or different. A third encapsulant layer may be positioned on a side of the plurality of photovoltaic cells opposite the incident light side. There may be a back sheet contacting this third encapsulant layer. The polymeric film may have at least one through-hole. The polymeric film may comprise multiple layers of polymers, wherein at least two of the polymers have a different refractive index. One or more of the layers on the incident light side of the polymeric film may absorb ultraviolet light. The photovoltaic module may be curved. The polymeric film may have a surface waviness of less than at least one of 1, 2, 3, 4, 5, 10, 15, 20, 25, 30, 40, 50, 60, 70, 80, 90, or 100 micrometers. The polymeric film may be tensioned.

In still another aspect, the present disclosure provides a method for fabricating a photovoltaic module comprising the preparation of a layer of photovoltaic cells and the arrangement of a polymeric film on an incident light side of the layer of photovoltaic cells, wherein the polymeric film transmits a range of wavelengths of the solar spectrum and specularly reflects wavelengths outside of the range, also wherein the polymeric film has a first surface area larger than a second surface area of the layer of photovoltaic cells.

The method may further comprise laminating an encapsulant layer between the polymeric film and the layer of photovoltaic cells. A portion of the encapsulant layer may fill a through-hole in the polymeric film. The method may also include the lamination of an additional encapsulant layer on an incident light side of the polymeric film. The fabrication method may also comprise arranging multiple layers of the polymeric film on the incident light side of the layer of photovoltaic cells, wherein at least two of the layers have a different refractive index. Also, it may further include a third encapsulant layer positioned on a side of the layer of photovoltaic cells opposite the incident light side. The lamination of a back sheet contacting the third encapsulant layer may occur. During lamination, a support structure may be placed under the photovoltaic cells. The polymeric film may be first laminated between the encapsulant layer and the additional encapsulant layer, followed by the encapsulant layer then being laminated to the photovoltaic cells. The method may include the polymeric film being first laminated between the encapsulant layer and the additional encapsulant layer, followed by the encapsulant layer then being laminated to another encapsulant layer on the photovoltaic cells. The method may also include tensioning the polymeric film during the arrangement the polymeric film on the incident light side of the layer of photovoltaic cells.

The photovoltaic module may comprise, from the incident light side, a front glass, an optional first encapsulant layer, a specularly reflecting and spectrally selective polymeric film, photovoltaic cells, a third encapsulant layer, and a back sheet or rear glass.

The method for fabricating a photovoltaic module may comprise a lamination process. Each of the layers or elements of the PVMirror may be freestanding prior to lamination, and may form a cohesive module, or laminate, after lamination. During the lamination process, heat, pressure, or some combination thereof, may be applied so that the encapsulant bonds the front glass, polymeric film, photovoltaic cells, and back sheet or rear glass together. This lamination process may, for example, include temperatures of 130 degrees Celsius and pressures of 750 Torr. Lamination may be performed in a laminator utilizing a vacuum bladder, like those commonly used to make photovoltaic modules, as will be appreciated by those familiar with the state of the art. In a first evacuation step, the PVMirror is heated to the melting temperature of the encapsulant and the vacuum eliminates air bubbles. In a second cure step, the temperature is further increased to the curing temperature of the encapsulant and external pressure is applied to form a uniform module.

The lamination process may also be tailored to reduce waviness of the polymeric film. The lamination process may be performed in two steps. In a first lamination, the polymeric film may be adhered to the front glass with the first encapsulant layer. In a second step, the photovoltaic cells and back sheet or rear glass may be adhered to the front glass/polymeric film laminate. Such a two-step lamination process may allow the first encapsulant layer to harden in the first lamination step with the polymeric film conformal to the front glass, preventing deformation of the first encapsulant layer and polymeric film during the second lamination step.

Additionally, the second encapsulant layer may be made thicker than the standard thickness used in photovoltaic modules. The enhanced thickness is aimed at reducing the waviness within the solar cell module. The thickness of the second encapsulant layer may be, for example, 400-1000 micrometers thick and may be composed of one sheet of this thickness or multiple thinner sheets that, together, have this thickness and that bond during encapsulation. The thick second encapsulant layer may deform around the contours of the photovoltaic cells during lamination. In a preferred embodiment, the second encapsulant layer may be composed of 2-5 sheets of 400 micrometers thick encapsulant.

In another embodiment aimed to reduce the waviness within the solar cell module, the first encapsulant layer may be omitted and the polymeric film may have holes, slits, or other cutouts. The polymeric film will then lay in direct contact with the rear surface of the front glass. The second encapsulant layer may penetrate through the holes, slits, or other cutouts at elevated temperature during lamination, and thus bond to the front glass. The holes, slits, or other cutouts may be of any size, shape, and periodicity, and may be designed to cover the smallest area of the polymeric film surface needed to achieve a desired adhesion. In this embodiment, strips of encapsulant may be placed between the polymeric film and front glass, in the location of the elsewhere omitted first encapsulant layer, along or near the perimeter of the PVMirror to bond the polymeric film to the front glass along the PVMirror perimeter.

The polymeric film may also have multiple layers of polymers. These polymers may have differing refractive indices. The refractive indices and thicknesses of the layers may be such that the polymeric film selectively reflects certain wavelengths of light and transmits others, as in a dichroic mirror or Bragg reflector. The polymeric film may transmit wavelengths similar to 700-1100 nanometers and reflect shorter and longer wavelengths. The polymeric film may include one or more polymer layers at its incident light side that absorb ultraviolet light and prevent this light from reaching the other layers so that the optical properties of those layers do not degrade in time. The polymeric film may have layers at its front or back surfaces that promote adhesion with the encapsulant layers or glass.

The polymeric film, which may be freestanding prior to lamination, may also have an area larger than the area of the front glass or any other layer or element in the PVMirror. This may result in the polymeric film being constrained at its edges when the bladder of a laminator is evacuated, preventing the polymeric film from shrinking or crumpling. Alternatively, any other method of tensioning the film during lamination may be employed.

The front glass, encapsulant layers, photovoltaic cells, and back sheet or rear glass may be of the same or similar material, dimensions, and properties as those used in the photovoltaic module industry, as will be appreciated by those familiar with the state of the art. For example, the front or rear glass may be low-iron glass 3-4 millimeters in thickness; the encapsulant layers may be ethylene-vinyl acetate (EVA), polyvinyl butyral, a silicone material, or an ionomer material; the photovoltaic cells may be multicrystalline silicon, monocrystalline silicon, cadmium telluride, or copper indium gallium selenide, and may have soldered front ribbons, SmartWire interconnection, or interdigitated back contacts; and the back sheet may be a polyvinyl fluoride film. In embodiments in which the PVMirror is curved, a support structure may be placed under the PVMirror during lamination. This support structure may prevent the front glass from breaking when pressure is applied. It may also transfer heat from a laminator bed to the PVMirror. The support structure may be made of any material, be of any shape that prevents glass breakage, and contact all or part of the surface of the PVMirror. In a preferred embodiment, the support structure may be metal and may be curved to have the same shape as the front glass, and it may be placed inside the bladder of a laminator with the PVMirror sitting atop it.

It is one advantage of the invention to provide a photovoltaic module comprising a plurality of photovoltaic cells with a polymeric film positioned on an incident light side of the plurality of photovoltaic cells. The polymeric film transmits a range of wavelengths of the incident light spectrum and specularly reflects wavelengths outside of the range.

It is another advantage of the invention to provide a method for fabricating a photovoltaic module, the method first preparing a layer of photovoltaic cells, then arranging a polymeric film on an incident light side of the plurality of photovoltaic cells.

The polymeric film transmits a range of wavelengths of the solar spectrum and specularly reflects wavelengths outside of the range.

Thus, the invention pertains generally to the conversion of sunlight to other forms of energy. It pertains more particularly to photovoltaic modules, and more particularly still to a PVMirror in which the spectrally selective element is a polymeric film that is laminated between the photovoltaic cells and the front glass of the module. In one embodiment, the front glass of the module is shaped such that light that were to reflect specularly from its rear (non-sunward) surface would arrive at the receiver, as desired. In this instance, the specularly reflecting polymeric film should be conformally attached to the front glass such that light reflected from the film will also arrive at the receiver. A planar PVMirror with this property will have the appearance of a mirror at the photon energies that are reflected and reflected images will be correctly rendered without imperfections such as elongation or bending. Conformal polymeric films, and thus the PVMirror in which they reside, are described as lacking waviness.

These and other features, aspects, and advantages of the present invention will become better understood upon consideration of the following detailed description, drawings, and appended claims.

BRIEF DESCRIPTION OF THE DRAWINGS

FIG. 5A is a photovoltaic module construction method in accordance with another embodiment of the present disclosure before lamination.

FIG. 5B is a photovoltaic module construction method in accordance with another embodiment of the present disclosure after application of heat and pressure.

FIG. 6A is a graph of the temperature profile of a method of two-stage lamination in accordance with another embodiment of the present disclosure.

FIG. 6B is a partially assembled photovoltaic module in accordance with another embodiment of the present disclosure.

FIG. 6C is the photovoltaic module of FIG. 6B in an assembled condition.

FIG. 7A is a graph showing the results of a one stage lamination.

FIG. 7B is a graph showing the results of a two stage lamination.

FIG. 9A is a photovoltaic module in accordance with another embodiment of the present disclosure.

FIG. 9B is a photovoltaic module in accordance with another embodiment of the present disclosure.

FIG. 9C is a graph showing the results of changing the number of encapsulant layers (EVA) in a photovoltaic module in accordance with the present disclosure.

FIG. 9D is a graph showing the results of changing the number of encapsulant layers (EVA) in another photovoltaic module in accordance with the present disclosure.

Like reference numerals will be used to refer to like parts from Figure to Figure in the following description of the drawings.

DETAILED DESCRIPTION OF THE INVENTION

Figure 1:
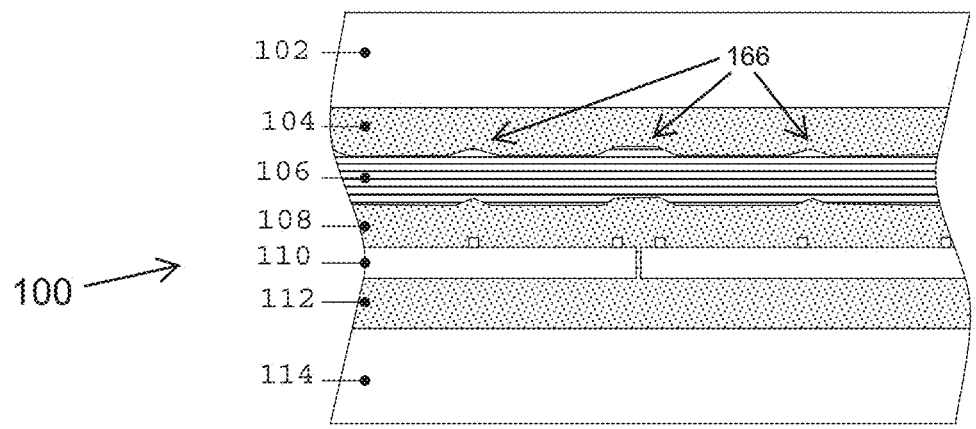
FIG. 1 is a photovoltaic module depicted with waviness as a result of standard photovoltaic module construction.

As shown in FIG. 1, a photovoltaic module 100 is comprised of a front glass 102, a first encapsulant layer 104, a polymeric film 106 that became wavy (see waviness 166 in FIG. 1) as a result of module construction methods, a second encapsulant layer 108, a layer of photovoltaic cells 110, a third encapsulant layer 112, and a back sheet or rear glass 114. In photovoltaic module 100 and embodiments of the present disclosure: (i) the front and/or rear glass may be low-iron glass 3-4 millimeters in thickness; (ii) the encapsulant layers may be ethylene-vinyl acetate, polyvinyl butyral, a silicone material, ionomer materials and combinations thereof; (iii) the polymeric film transmits a range of wavelengths of the incident light spectrum and specularly reflects wavelengths outside of the range, wherein the range of wavelengths is preferably 700-1100 nanometers; (iv) the photovoltaic cells may be multicrystalline silicon, monocrystalline silicon, cadmium telluride, or copper indium gallium selenide, and may have soldered front ribbons, Smart-Wire interconnection, or interdigitated back contacts (IBC); and (v) the back sheet may be a fluorinated polymer film such as a polyvinyl fluoride film available from DuPont under the trade name Tedlar®.

Figure 2:
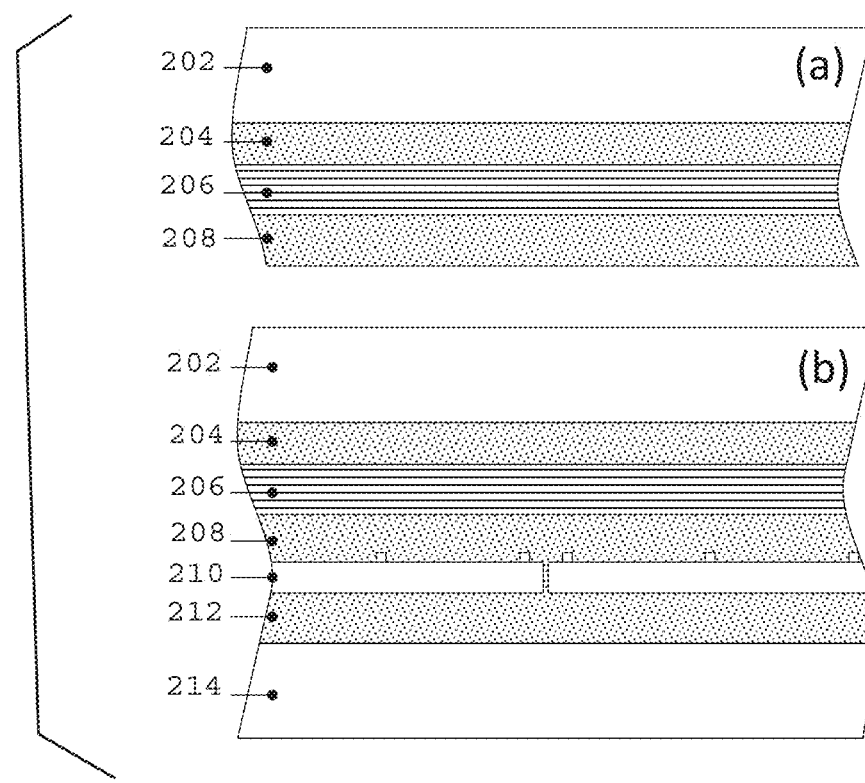
FIG. 2 is a photovoltaic module in accordance with another embodiment of the present disclosure.

As shown in one embodiment in FIG. 2, the photovoltaic module 200 is constructed in a two-step lamination process. This two-step process is done in order to reduce the waviness of polymeric film 206. Front glass 202, first encapsulant layer 204, polymeric film 206, and second encapsulant layer 208 are laminated in the first step (a). Front glass 202, first encapsulant layer 204, polymeric film 206, and second encapsulant layer 208 are then laminated with the remaining layers in the second step (b), creating a photovoltaic module with a front glass 202, a first encapsulant layer 204, a polymeric film 206 that is lacking waviness, a second encapsulant layer 208, a layer of photovoltaic cells 210, a third encapsulant layer 212, and a back sheet or rear glass 214.

Figure 3:
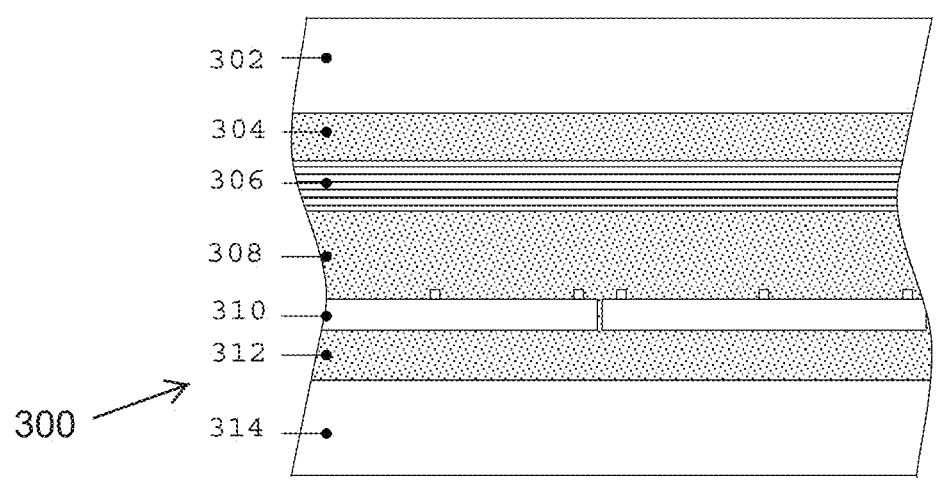
FIG. 3 is a photovoltaic module in accordance with another embodiment of the present disclosure.

As shown in another embodiment in FIG. 3, the photovoltaic module 300 is constructed with a thicker second encapsulant layer 308. This is done to reduce the waviness of polymeric film 306. The thicker second encapsulant layer may be, for example, 400 to 1000 micrometers thick. It may also be composed of one sheet or multiple sheets. Front glass 302, first encapsulant layer 304, polymeric film 306, thick second encapsulant layer 308, photovoltaic cells 310, third encapsulant layer 312, and a back sheet or rear glass 314 form the photovoltaic module 300.

Figure 4:
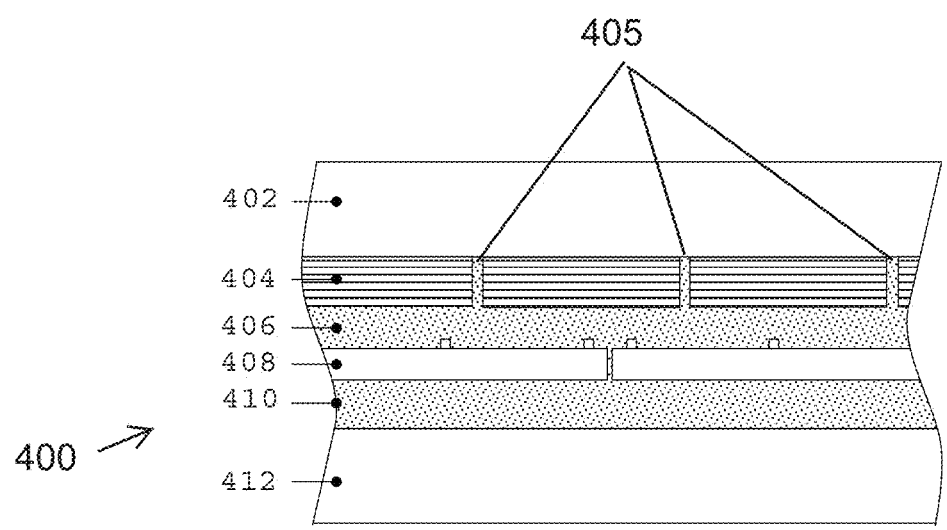
FIG. 4 is a photovoltaic module in accordance with another embodiment of the present disclosure.

As shown in yet another embodiment in FIG. 4, the photovoltaic module 400 is constructed with one or more through-holes 405 in the polymeric film 404. Holes 405 within the polymeric film 404 help to reduce waviness. This occurs because the polymeric film 404 can then lay in direct contact with the rear surface of the front glass 402. Material of the second encapsulant layer 406 may then penetrate the holes and bond to the front glass 402. In this embodiment, the typical first encapsulant layer may be omitted. The layer of photovoltaic cells 408, third encapsulant layer 410, and back sheet or rear glass 412 may remain unchanged from the typical photovoltaic module embodiment.

The lamination process, which may comprise increased pressure and increased temperature is demonstrated in FIG. 5A and FIG. 5B. In this embodiment, the construction of the photovoltaic module 500 results in waviness 566 in the polymeric film 506. This occurs due to the deformation of first encapsulant layer 504 (which is less than 400 micrometers thick) and polymeric film 506 during the lamination process.

The layer of photovoltaic cells 510, first encapsulant layer 504, front glass 502, and back sheet or rear glass 514 may remain unchanged from the typical photovoltaic module embodiment.

Figure 8A:
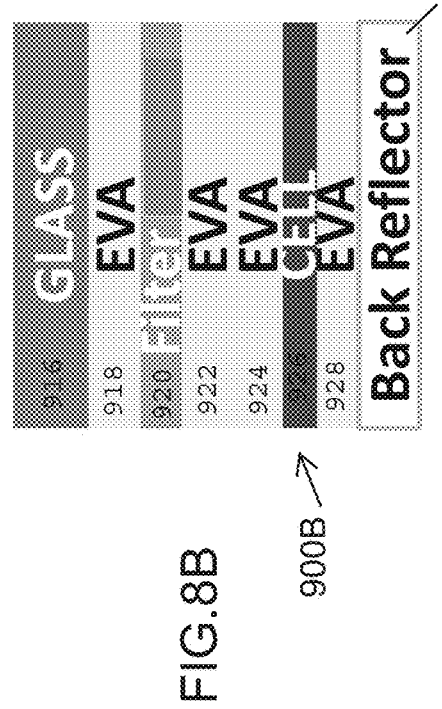
FIG. 8A is a photovoltaic module in accordance with another embodiment of the present disclosure.
Figure 8B:
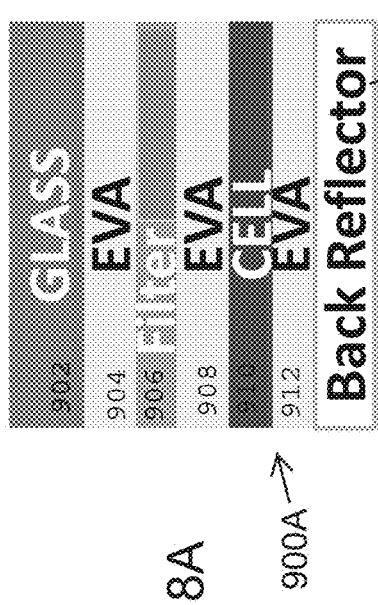
FIG. 8B is a photovoltaic module in accordance with another embodiment of the present disclosure.
Figure 8C:
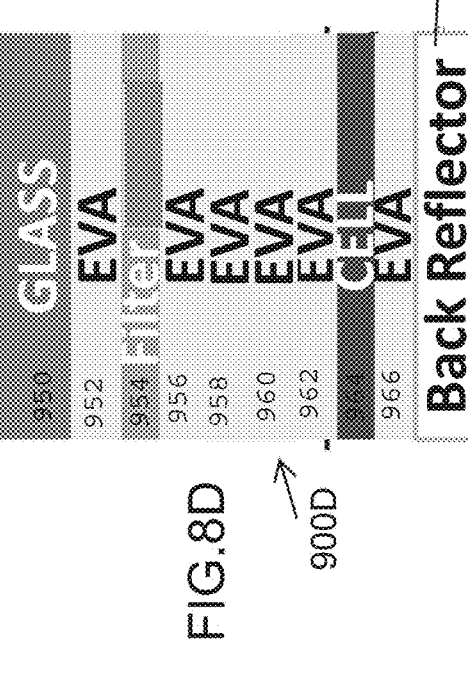
FIG. 8C is a photovoltaic module in accordance with another embodiment of the present disclosure.
Figure 8D:
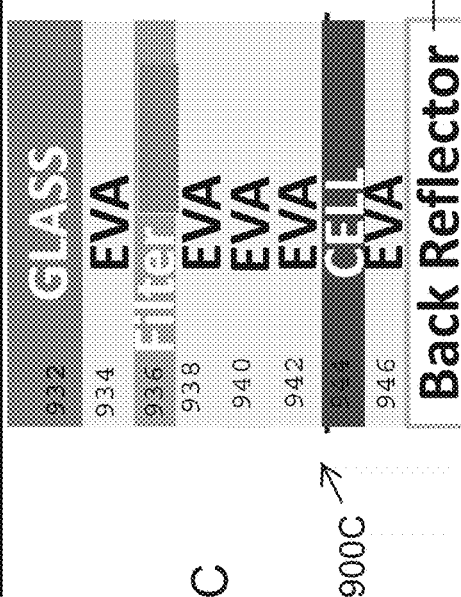
FIG. 8D is a photovoltaic module in accordance with another embodiment of the present disclosure.

In another embodiment, multiple layers may be used in the second encapsulant layer. The second encapsulant layer may be composed of 2-5 sheets of encapsulant. FIG. 8A-FIG. 8D demonstrate possible embodiments of 3 to 6 layers of encapsulant. FIG. 8A depicts a front glass 902, first encapsulant layer 904, polymeric film 906, second encapsulant layer 908, photovoltaic cells 910, third encapsulant layer 912, and back reflector 914 of a photovoltaic module 900A. FIG. 8B depicts the photovoltaic module 900B with an additional layer of encapsulant, specifically, a front glass 916, first layer of encapsulant 918, polymeric film 920, one sheet of encapsulant 922 and a second sheet of encapsulant 924 that together comprise the second encapsulant layer, photovoltaic cells 926, third encapsulant layer 928, and back reflector 930 of the photovoltaic module 900B. FIG. 8C shows a photovoltaic module 900C with another additional layer of encapsulant, specifically, a front glass 932, first encapsulant layer 934, polymeric film 936, one sheet of encapsulant 938, a second sheet of encapsulant 940, a third sheet of encapsulant 942, where the three encapsulant sheets 938, 940, 942 form the second encapsulant layer, the photovoltaic cells 944, third encapsulant layer 946, and back reflector or sheet 948. Additionally, FIG. 8D shows a photovoltaic module 900D with yet another additional layer of encapsulant, specifically, a front glass 950, first encapsulant layer 952, polymeric film 954, one sheet of encapsulant 956, a second sheet of encapsulant 958, a third encapsulant sheet 960, a fourth encapsulant sheet 962, where the four encapsulant sheets 956, 958, 960, 962 form the second encapsulant layer, the photovoltaic cells 964, the third encapsulant layer 966, and back reflector or sheet 968. The thickness of the second encapsulant layer may be, for example, 400-1000 micrometers thick.

Figure 10:
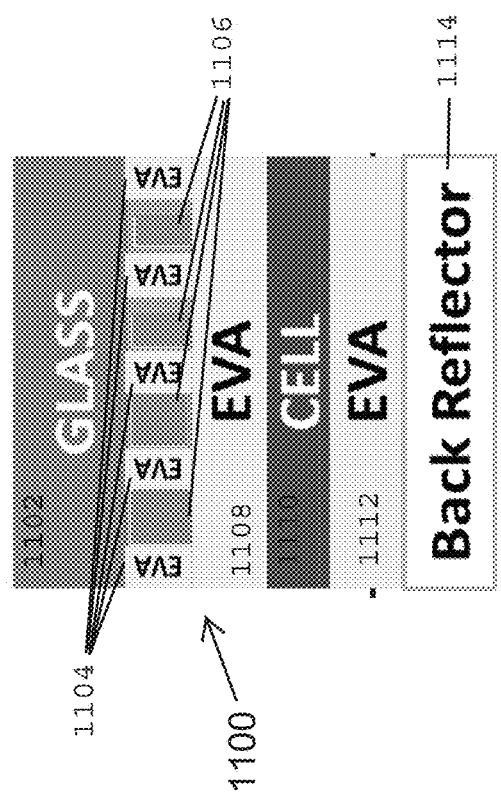
FIG. 10 is a photovoltaic module with a number of through-holes (filled with EVA) in the polymeric film in accordance with another embodiment of the present disclosure.
Figure 11:
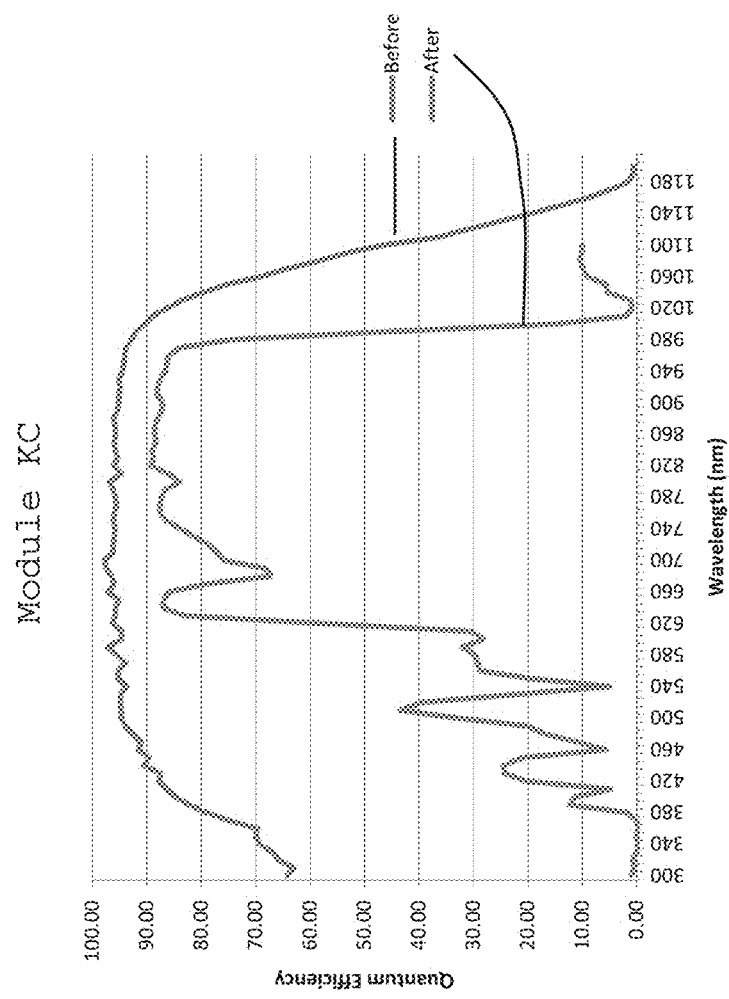
FIG. 11 is a graph showing the quantum efficiency of a solar cell before and after lamination in a photovoltaic module.

In an additional embodiment in FIG. 10, through-holes 1104 in the polymeric film 1106 of the photovoltaic module 1100 reduces waviness after module lamination occurs. In this embodiment, the first encapsulant layer may be omitted. This allows the second encapsulant layer 1108 to penetrate through the one or more through-holes 1104, and thus bond to the front glass 1102. In this embodiment, there exists a front glass 1102, polymeric film 1106 with at least one through-hole 1104, a second encapsulant layer 1108 that may fill in the through-hole(s) 1104 during the process of lamination, a layer of photovoltaic cells 1110, a third encapsulant layer 1112, and a back reflector or sheet 1114.

EXAMPLES

The following Examples are provided in order to demonstrate and further illustrate certain embodiments and aspects of the present invention and are not to be construed as limiting the scope of the invention.

Example 1

A two-stage lamination process can reduce the waviness of the polymeric film. FIG. 6B shows the partial module 700 after the first lamination. FIG. 6C shows the completed module 700 after the second lamination. The photovoltaic module 700 is made up of front glass 702, first encapsulant layer 704 comprising EVA, polymeric film 706 (the polymeric film capable of transmitting wavelengths within the 700-1100 nm range and reflecting wavelengths outside of the range), second encapsulant layer (composed of encapsulant layer 708 and encapsulant layer 710 comprising EVA), a layer of photovoltaic cells 712, a third encapsulant layer 714 comprising EVA, and back reflector 716. FIG. 6A depicts the method of the two-stage lamination process: the front glass is combined with the first two layers of encapsulant and with the polymeric film, the encapsulant is melted in a temperature range of 65° C. to 95° C. for 3 to 5 minutes, then cured in a temperature range of 120° C. to 155° C. for 9 to 13 minutes, cooled for 10 to 15 minutes, the additional layers are added, encapsulant is melted in a temperature range of 65° C. to 95° C. for 3 to 5 minutes, and finally the encapsulant is cured in a temperature range of 120° C. to 155° C. for 9 to 13 minutes. FIG. 7A shows the results of a one-stage lamination, and FIG. 7B shows the results of a two-stage lamination. Both modules utilize curved glass shaped into a parabolic trough so that, in the absence of waviness in the polymeric film, reflected light arrives a line focus a distance away from the module. When two-stage lamination occurs, the reflected light forms a more perfect line focus 804 than the line focus 802 when one-stage lamination occurs, as shown in FIGS. 7A and 7B.

Thus, the present invention provides a method of two-stage lamination that reduces waviness in the polymeric film.

Example 2

Increasing the number of encapsulant layers can reduce waviness of the polymeric film. FIG. 9A shows the standard formation of the photovoltaic module 1000A: front glass 1002, first encapsulant layer 1004, polymeric film 1006, second encapsulant layer 1008, photovoltaic cells 1010, third encapsulant layer 1012, and back reflector 1014. FIG. 10B shows the preferred embodiment of the solar module 1000B: front glass 1016, first encapsulant layer 1018 comprising EVA, polymeric film 1020 (using the same material as film 606), second encapsulant layer (composed of encapsulant layer 1022, encapsulant layer 1024, and encapsulant layer 1026 comprising EVA), photovoltaic cells 1028, third encapsulant layer 1030 comprising EVA, and back reflector 1032. FIG. 9D show the experimental absorbance results by wavelength for increasing thickness of the second encapsulant layer. The results show that absorbance changes little as the thickness of the second encapsulant layer increases.

Thus, the present invention provides a method for decreasing the waviness of the polymeric film through increasing the thickness of the second encapsulant layer.

Example 3

A photovoltaic module identified as "Module KC" was constructed. Module KC had the following layers: glass/polymeric film with through holes/EVA/photovoltaic cell/EVA/backsheet.

Example 4

Figure 12:
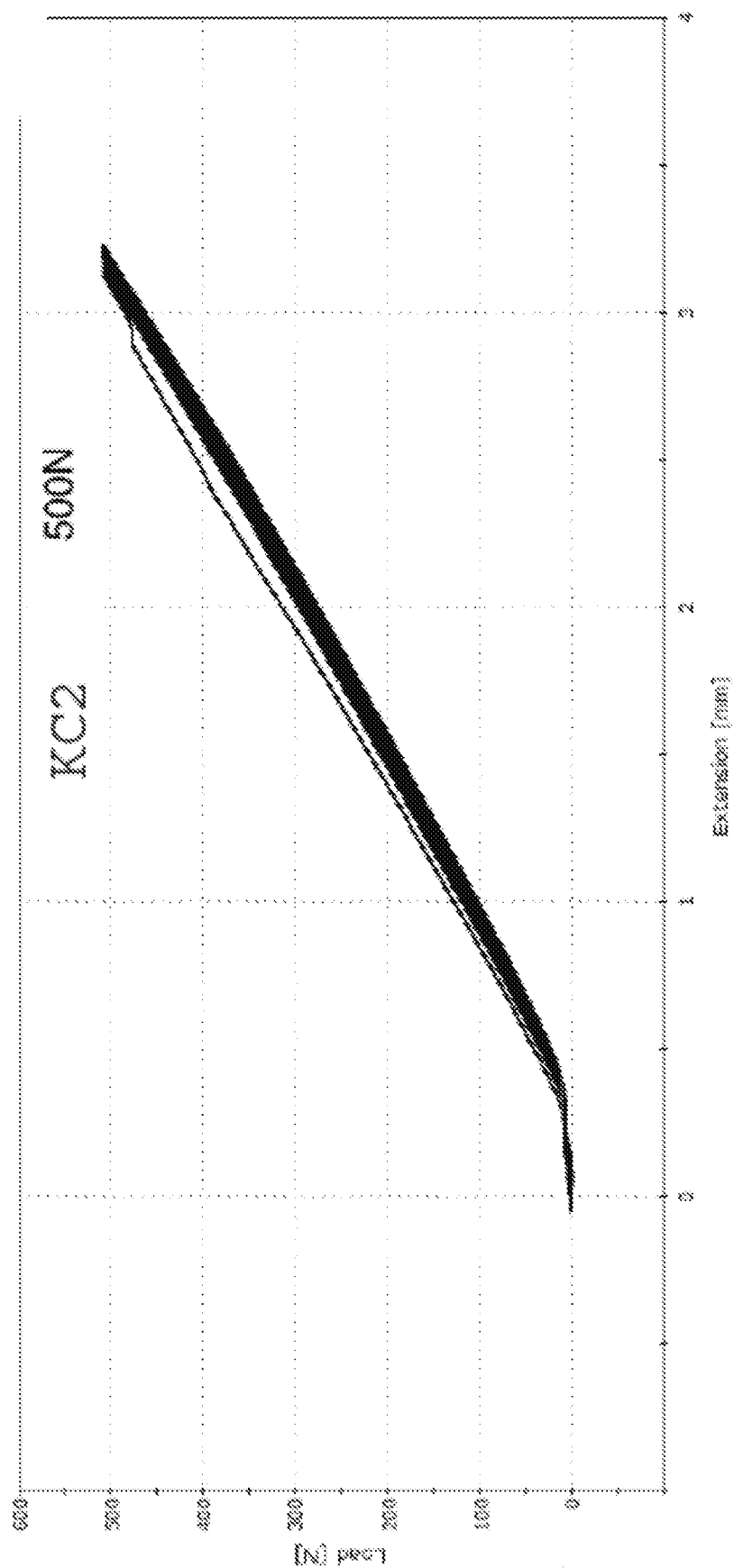
FIG. 12 is a graph showing the results of wind load testing for one photovoltaic module in accordance with another embodiment of the present disclosure.
Figure 13:
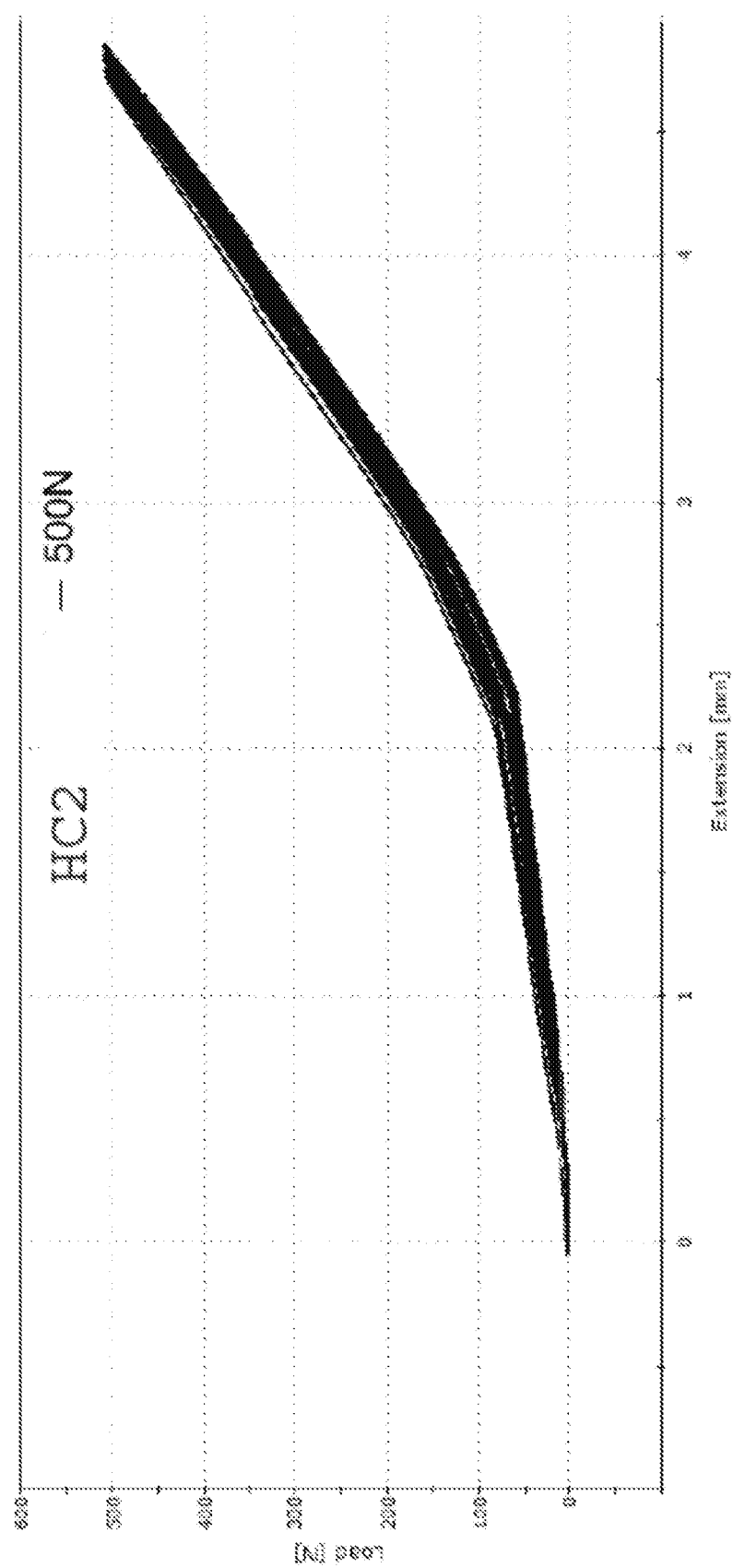
FIG. 13 is a graph showing the results of wind load testing for one photovoltaic module in accordance with another embodiment of the present disclosure.
Figure 14:
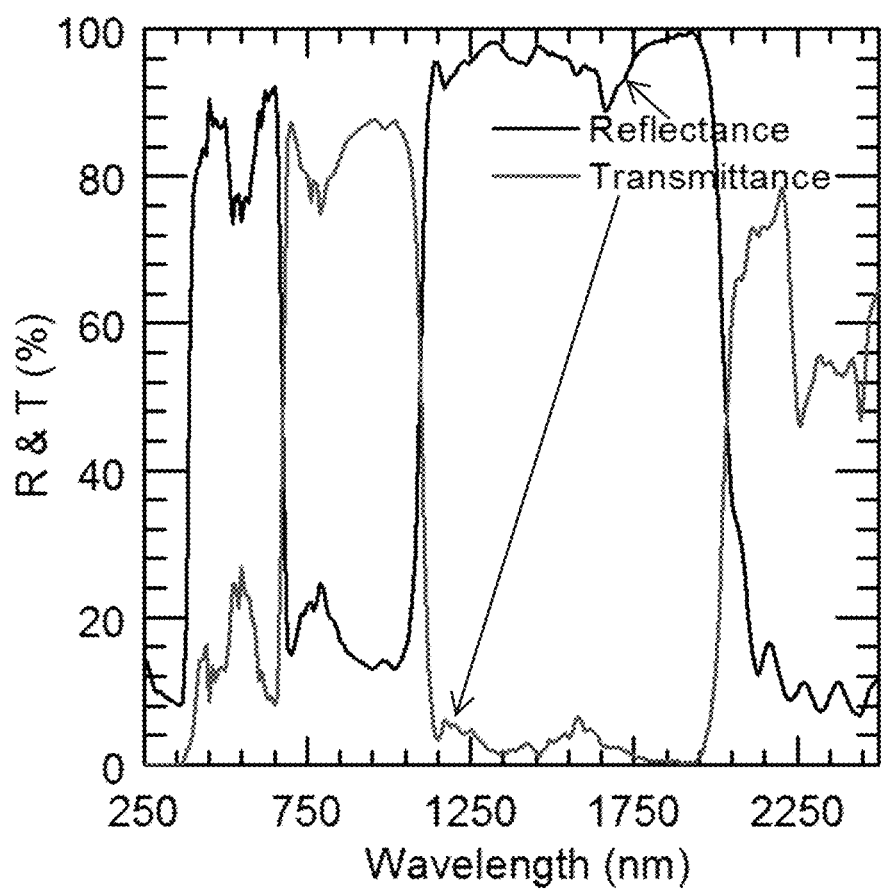
FIG. 14 is a graph showing the measured transmittance and reflectance of the experimental polymeric film used in the Examples outlined below.

A photovoltaic module identified as "Module KC2" was constructed. Module KC2 had the following layers: glass/polymeric film with through holes/EVA/photovoltaic cell/EVA/backsheet. A photovoltaic module identified as "Module HC2" was constructed. Module HC2 had the following layers: glass/polymeric film with through holes/EVA/photovoltaic cell/EVA/backsheet. FIGS. 12-13 show wind load testing in which the module was subjected 100 times to a force equivalent to a 100 mile per hour wind for Module HC2 and Module KC2.

Thus, the present invention provides a solar cell comprising a plurality of photovoltaic cells, and a polymeric film positioned on an incident light side of the plurality of photovoltaic cells, wherein the polymeric film transmits a range of wavelengths of the incident light spectrum and specularly reflects wavelengths outside of the range.

Although the invention has been described in considerable detail with reference to certain embodiments, one skilled in the art will appreciate that the present invention can be practiced by other than the described embodiments, which have been presented for purposes of illustration and not of limitation. Therefore, the scope of the appended claims should not be limited to the description of the embodiments contained herein.

What is claimed is:

1. A photovoltaic module comprising:
a plurality of photovoltaic cells;
a polymeric film positioned on an incident light side of the plurality of photovoltaic cells, wherein the polymeric film transmits a range of wavelengths of the incident light spectrum and specularly reflects wavelengths outside of the range of wavelengths;
a first encapsulant layer positioned between and in contact with the polymeric film and the plurality of photovoltaic cells; and
a second encapsulant layer positioned on the incident light side of and in contact with the polymeric film,
wherein a thickness of the first encapsulant layer exceeds a thickness of the second encapsulant layer.

2. The photovoltaic module of claim 1 wherein the range of wavelengths is 700-1100 nanometers.

3. The photovoltaic module of claim wherein the first encapsulant layer has a thickness of 400 micrometers to 1000 micrometers.

4. The photovoltaic module of claim 1, wherein:
the first encapsulant layer comprises a first polymer selected from ethylene vinyl acetate, polyvinyl butyral, silicones, and ionomers, and
the second encapsulant layer comprises a second polymer selected from ethylene vinyl acetate, polyvinyl butyral, silicones, and ionomers, and the first polymer and the second polymer are the same or different.

5. The photovoltaic module of claim 1, wherein the polymeric film has at least one through-hole.

6. The photovoltaic module of claim 1, wherein the polymeric film comprises multiple layers of polymers, at least two of the polymers having a different refractive index.

7. The photovoltaic module of claim 1, wherein the polymeric film has a surface waviness of less than 100 micrometers.

8. A method for fabricating the photovoltaic module of claim 1, the method comprising:
preparing a layer of the plurality of photovoltaic cells;
positioning the first encapsulant layer between and in contact with the polymeric film and the plurality of photovoltaic cells; and
positioning the second encapsulant layer on the incident light side of and in contact with the polymeric film.

9. The method of claim 8, further comprising laminating the first encapsulant layer between the polymeric film and the layer of the plurality of photovoltaic cells.

10. The method of claim 8, wherein a portion of the first encapsulant layer fills a through-hole in the polymeric film.

11. The method of claim 8, further comprising laminating the second encapsulant layer on the incident light side of the polymeric film.

12. The method of claim 8, further comprising arranging multiple layers of the polymeric film on the incident light side of the layer of the plurality of photovoltaic cells, wherein at least two of the layers of the polymeric film having a different refractive index.

13. The method of claim 9, further comprising placing a support structure under the plurality of photovoltaic cells during lamination.

14. The method of claim 11, wherein:
the polymeric film is first laminated between the first encapsulant layer and the second encapsulant layer; and
the first encapsulant layer is then laminated to the plurality of photovoltaic cells.

15. The method of claim 11 wherein:
the polymeric film is first laminated between the first encapsulant layer and the second encapsulant layer; and
the first encapsulant layer is then laminated to an additional encapsulant layer on the plurality of the photovoltaic cells.

16. The photovoltaic module of claim 1, wherein the first encapsulant layer is positioned between and in direct contact with the plurality of photovoltaic cells and the polymeric film.

17. The photovoltaic module of claim 1, wherein the second encapsulant layer has a thickness of 100 micrometers to 500 micrometers.

18. The photovoltaic module of claim 17, wherein the first encapsulant layer has a thickness of 400 micrometers to 1000 micrometers.

19. The photovoltaic module of claim 18, wherein the polymeric film has a surface waviness of less than 100 micrometers.

20. The photovoltaic module of claim 1, wherein a thickness of the second encapsulant layer is about half the thickness of the first encapsulant layer.

21. The photovoltaic module of claim 20, wherein the polymeric film has a surface waviness of less than 100 micrometers.

22. The photovoltaic module of claim 1, wherein the first encapsulant layer comprises 2 to 5 laminated polymeric layers.

23. The photovoltaic module of claim 1, further comprising a third encapsulant layer positioned on a side of the plurality of photovoltaic cells opposite the incident light side.

* * * * *